(12) United States Patent
Huang et al.

(10) Patent No.: US 11,075,360 B2
(45) Date of Patent: Jul. 27, 2021

(54) DISPLAY PANEL, DISPLAY DEVICE AND METHOD FOR MANUFACTURING DISPLAY PANEL

(71) Applicant: BOE TECHNOLOGY GROUP CO., LTD., Beijing (CN)

(72) Inventors: Qingyu Huang, Beijing (CN); Zhiqiang Jiao, Beijing (CN); Zhongyuan Sun, Beijing (CN); Xiang Zhou, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 15 days.

(21) Appl. No.: 16/607,346

(22) PCT Filed: May 7, 2019

(86) PCT No.: PCT/CN2019/085808
§ 371 (c)(1),
(2) Date: Oct. 22, 2019

(87) PCT Pub. No.: WO2020/029625
PCT Pub. Date: Feb. 13, 2020

(65) Prior Publication Data
US 2020/0274095 A1    Aug. 27, 2020

(30) Foreign Application Priority Data

Aug. 6, 2018    (CN) .......................... 201810886384.X

(51) Int. Cl.
| H01L 51/52 | (2006.01) |
| H01L 27/32 | (2006.01) |
| H01L 51/56 | (2006.01) |

(52) U.S. Cl.
CPC ...... H01L 51/5253 (2013.01); H01L 27/3246 (2013.01); H01L 51/56 (2013.01)

(58) Field of Classification Search
CPC .. H01L 51/5253; H01L 27/3246; H01L 51/56
See application file for complete search history.

(56) References Cited

U.S. PATENT DOCUMENTS

| 2009/0195147 A1 | 8/2009 | Song et al. |
| 2011/0140163 A1 | 6/2011 | Oh et al. |
| (Continued) | | |

FOREIGN PATENT DOCUMENTS

| CN | 103985739 A | 8/2014 |
| CN | 104505469 A | 4/2015 |
| (Continued) | | |

OTHER PUBLICATIONS

International Search Report of PCT/CN2019/085808, dated Aug. 5, 2019, 15 pages.

(Continued)

*Primary Examiner* — Stephen W Smoot
*Assistant Examiner* — Vicki B. Booker
(74) *Attorney, Agent, or Firm* — Muncy, Geissler, Olds & Lowe, P.C.

(57) ABSTRACT

An OLED display panel, a display device and a method for manufacturing the OLED display panel are provided. The display panel includes a display panel body, and an encapsulation layer disposed on the display panel body and applied to encapsulate the display panel body. The encapsulation layer has a gradually increasing thickness in a direction from a central position of the display panel to an edge position of the display panel.

17 Claims, 3 Drawing Sheets

(56) References Cited

U.S. PATENT DOCUMENTS

2012/0313516 A1 12/2012 Kim et al.
2016/0028032 A1 1/2016 Okada
2020/0209916 A1* 7/2020 Zhang ................. H01L 51/5237

FOREIGN PATENT DOCUMENTS

| CN | 105009689 A | 10/2015 |
| CN | 106450035 A | 2/2017 |
| CN | 207834361 U | 9/2018 |
| CN | 109004013 A | 12/2018 |
| KR | 100696556 B1 | 3/2007 |
| KR | 20170071662 A | 6/2017 |

OTHER PUBLICATIONS

Office Action of CN Application No. 201810886384.X, dated Apr. 2, 2020, 13 pages.

* cited by examiner

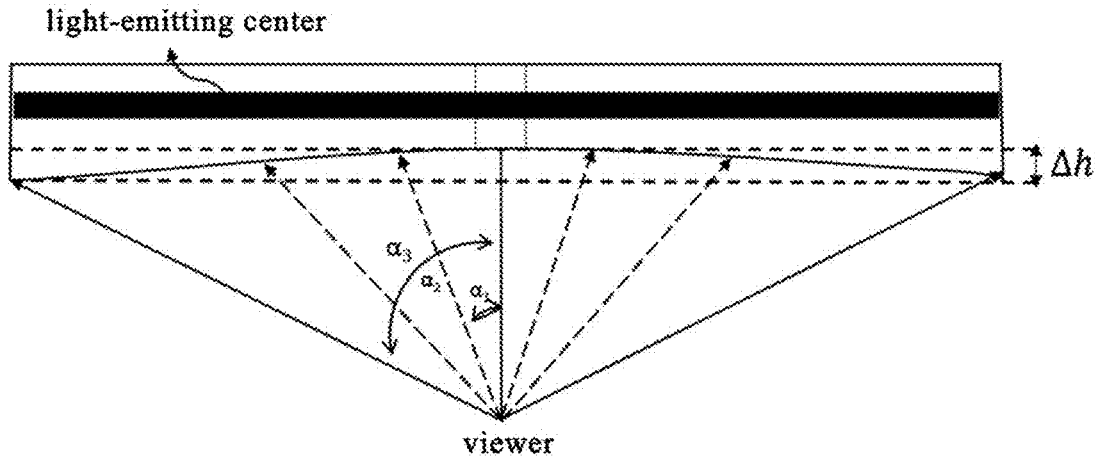

FIG. 5

```
┌─────────────────────────────────────────────────┐
│ forming an encapsulation layer that has a       │── 101
│ gradually increasing thickness in a direction   │
│ from a central position of the display panel    │
│ to an edge position of the display panel        │
└─────────────────────────────────────────────────┘
```

FIG. 6

```
┌─────────────────────────────────────────────────┐
│ forming a pixel-defining layer that has a       │
│ gradually increasing thickness in the direction │── 101a
│ from the central position of the display panel  │
│ to the edge position of the display panel       │
└─────────────────────────────────────────────────┘
                        │
                        ▼
┌─────────────────────────────────────────────────┐
│ forming, on the pixel-defining layer, an etched │
│ spacer that has an equal or gradually           │── 101b
│ increasing thickness in the direction from the  │
│ central position of the display panel to the    │
│ edge position of the display panel              │
└─────────────────────────────────────────────────┘
                        │
                        ▼
┌─────────────────────────────────────────────────┐
│ forming an encapsulation layer that has a       │── 101
│ gradually increasing thickness in a direction   │
│ from a central position of the display panel    │
│ to an edge position of the display panel        │
└─────────────────────────────────────────────────┘
```

FIG. 7

DISPLAY PANEL, DISPLAY DEVICE AND METHOD FOR MANUFACTURING DISPLAY PANEL

CROSS-REFERENCE TO RELATED APPLICATION

The present application is the U.S. national phase of PCT Application No. PCT/CN2019/085808 filed on May 7, 2019, which claims a priority of the Chinese Patent Application No. 201810886384.X filed on Aug. 6, 2018, which are incorporated herein by reference in their entirety.

TECHNICAL FIELD

The present disclosure relates to the field of display technology, in particular to an OLED (Organic Light-emitting Diode) display panel, a display device, and a method for manufacturing the OLED display panel.

BACKGROUND

OLED display devices have a series of excellent characteristics such as self-luminescence, no backlight module, high contrast and definition, wide viewing angle, fully-cured state, capability of adopting flexible panels, good temperature characteristics, low power consumption, fast response speed, and low manufacturing cost, and therefore have become one of key development trends of new-generation flat display devices and attract more and more attentions.

At present, all kinds of OLEDs have been applied to mobile phones and become rapidly widespread as products. Also, TVs using the OLEDs have gradually begun to prevail with great popularity. However, the TVs using the OLEDs have a drawback in terms of display. To be specific, when a viewer gradually increases his/her viewing angle from a center of a large-screen display panel with the viewing angle of zero towards an edge position of the display panel, a wavelength of light observed by the viewer may shift, which results in color inconsistency between the central position and the edge position of the display panel, thereby adversely affecting viewing experience.

SUMMARY

In a first aspect, embodiments of the present disclosure provide a display panel, including a display panel body, and an encapsulation layer disposed on the display panel body. The encapsulation layer has a gradually increasing thickness in a direction from a central position of the display panel to an edge position of the display panel.

According to some optional embodiments of the present disclosure, the thickness of the encapsulation layer gradually increases at a plurality of points in the direction from the central position of the display panel to the edge position of the display panel.

According to some optional embodiments of the present disclosure, the display panel body includes a base substrate and one or more pixel units disposed on the base substrate.

According to some optional embodiments of the present disclosure, the display panel further includes a pixel-defining layer that has a gradually increasing thickness in the direction from the central position of the display panel to the edge position of the display panel.

According to some optional embodiments of the present disclosure, the thickness of the pixel-defining layer gradually increases at a plurality of points in the direction from the central position of the display panel to the edge position of the display panel.

According to some optional embodiments of the present disclosure, the display panel further includes one or more spacers disposed on the pixel-defining layer and having an equal or gradually increasing thickness in the direction from the central position of the display panel to the edge position of the display panel.

According to some optional embodiments of the present disclosure, the thickness of the one or more spacers disposed on the pixel-defining layer is equal or gradually increasing in the direction from the central position of the display panel to the edge position of the display panel.

According to some optional embodiments of the present disclosure, the display panel further includes a base substrate, and pixel units disposed on the base substrate and covered by the encapsulation layer, a combination layer at adjacent pixel units in a horizontal direction of the display panel having a difference in thickness $\Delta h_1$;

$$\Delta h_1 = 2 \times |H_0 - H_{n-1}|/(n-1)$$

where the combination layer comprises the pixel-defining layer and the spacer, $H_0$ is a thickness of the combination layer of the pixel units on a center line of the display panel perpendicular to the horizontal direction, $H_{n-1}$ is a thickness of the combination layer of the pixel unit at the edge position of the display panel in the horizontal direction, and n is the number of the pixel units of the display panel in the horizontal direction.

According to some optional embodiments of the present disclosure, the display panel further includes a base substrate and pixel units disposed on the base substrate and covered by the encapsulation layer, a combination layer at adjacent pixel units in a vertical direction of the display panel having a difference in thickness $\Delta h_2$;

$$\Delta h_2 = 2 \times |H_0 - H_{m-1}|/(m-1)$$

where the combination layer comprises the pixel-defining layer and the spacer, $H_0$ is a thickness of the combination layer of the pixel units on a center line of the display panel parallel to the horizontal direction, $H_{m-1}$ is a thickness of the combination layer of the pixel unit at the edge position of the display panel in the vertical direction, and m is the number of the pixel units of the display panel in the vertical direction.

According to some optional embodiments of the present disclosure, $\Delta h_1$ or $\Delta h_2$ has a value ranging from 5 μm to 20 μm.

According to some optional embodiments of the present disclosure, there is one, or a group, of the pixel units at the central position of the display panel.

According to some optional embodiments of the present disclosure, regions of the encapsulation layer covered on the group of the pixel units at the central position have a same thickness.

According to some optional embodiments of the present disclosure, the display panel is an OLED display panel.

In a second aspect, embodiments of the present disclosure provide an OLED display panel including the display panel as described in the first aspect.

In a third aspect, embodiments of the present disclosure provide a method for manufacturing the OLED display panel as described in the first aspect, including forming the encapsulation layer that has the gradually increasing thickness in the direction from the central position of the display panel to the edge position of the display panel.

According to some optional embodiments of the present disclosure, the thickness of the encapsulation layer gradually increases at a plurality of points in the direction from the central position of the display panel to the edge position of the display panel.

According to some optional embodiments of the present disclosure, prior to forming the encapsulation layer, the method further includes forming a pixel-defining layer that has a gradually increasing thickness in the direction from the central position of the display panel to the edge position of the display panel.

According to some optional embodiments of the present disclosure, the thickness of the pixel-defining layer gradually increases at a plurality of points in the direction from the central position of the display panel to the edge position of the display panel.

According to some optional embodiments of the present disclosure, after forming the pixel-defining layer and before forming the encapsulation layer, the method further includes forming, on the pixel-defining layer, one or more spacers that have an equal or gradually increasing thickness in the direction from the central position of the display panel to the edge position of the display panel.

According to some optional embodiments of the present disclosure, the thickness of the one or more spacers disposed on the pixel-defining layer is equal or gradually increasing in the direction from the central position of the display panel to the edge position of the display panel.

BRIEF DESCRIPTION OF THE DRAWINGS

In order to illustrate the technical solutions in the embodiments of the present disclosure or in the related art more clearly, the accompanying drawings necessary for the description of the embodiments will be briefly described below. It is obvious that the drawings in the following description relate to only some of the embodiments of the present disclosure, and based on these drawings, other drawings can be obtained by those having ordinary skills in the art without any inventive effort.

FIG. 5 is a schematic diagram showing a variation in a viewing angle when a viewer views the OLED display panel according to the embodiment of the present disclosure;

FIG. 6 is a first flowchart of a method for manufacturing an OLED display panel according to an embodiment of the present disclosure; and FIG. 7 is a second flowchart of the method for manufacturing the OLED display panel according to the embodiment of the present disclosure.

DETAILED DESCRIPTION

To make the technical problems to be solved, technical solutions, and advantages of the present disclosure more apparent, detailed description will be made below in conjunction with the drawings and specific embodiments.

Figure 1A:
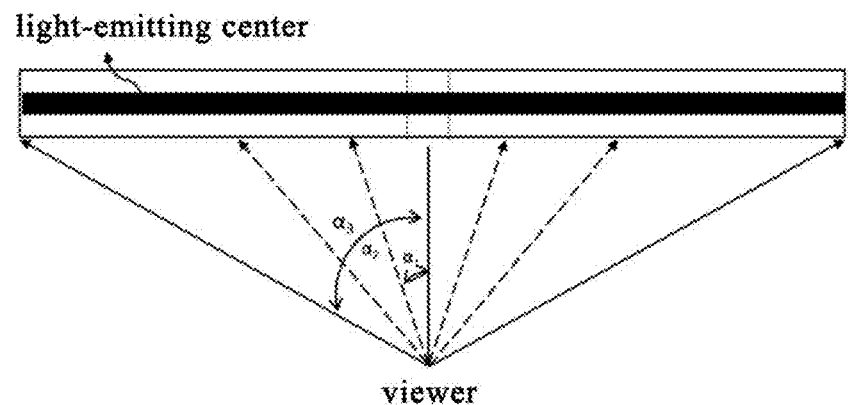
FIG. 1A is a schematic diagram showing a variation in a viewing angle when a viewer views a large-screen display panel (a flat screen) in the related art.
Figure 1B:
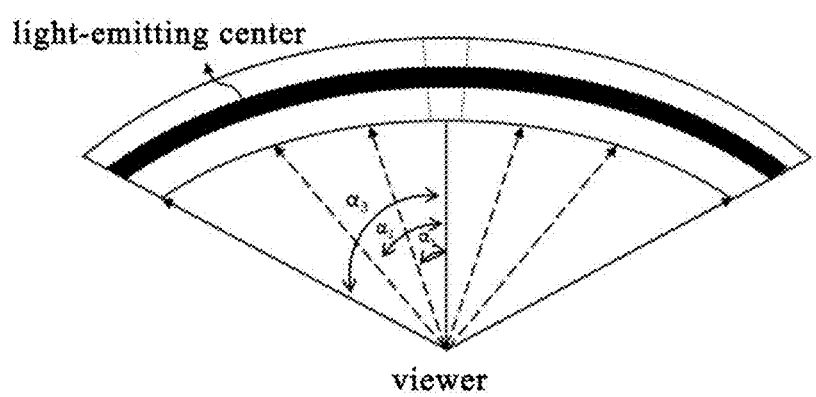
FIG. 1B is another schematic diagram showing a variation in a viewing angle when a viewer views a large-screen display panel (a curved screen) in the related art.

FIG. 1A and FIG. 1B are schematic diagrams showing variations in viewing angles when a viewer views large-screen display panels in the related art. FIG. 1A shows a flat screen, and FIG. 1B shows a curved screen. When the viewer gradually increases his/her viewing angle from a center of the large-screen display panel with the viewing angle of zero towards an edge position ED of the display panel, a wavelength of light observed by the viewer may shift, which results in color inconsistency between the central position CE and the edge position ED of the display panel, thereby badly affecting the viewing experience. Embodiments of the present disclosure provide an OLED display panel, capable of effectively mitigating the phenomenon of a blue shift of a luminescence peak position of pixels at the edge of the display panel.

Figure 2:
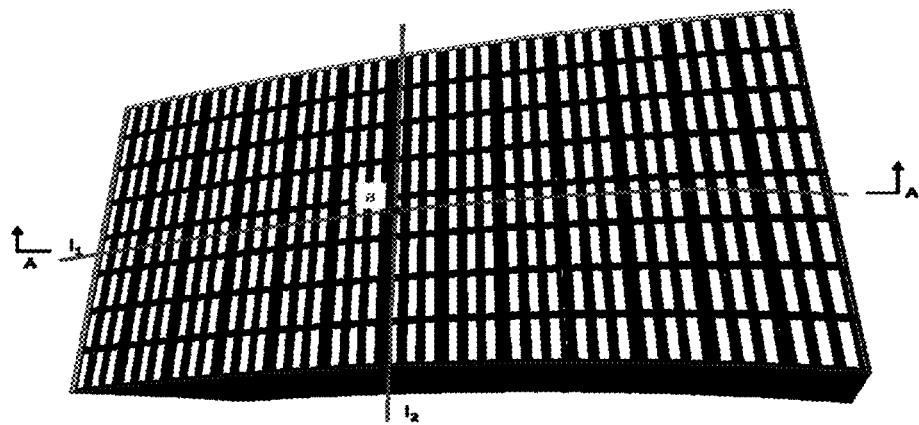
FIG. 2 is a schematic diagram showing a structure of an OLED display panel according to an embodiment of the present disclosure.
Figure 3:
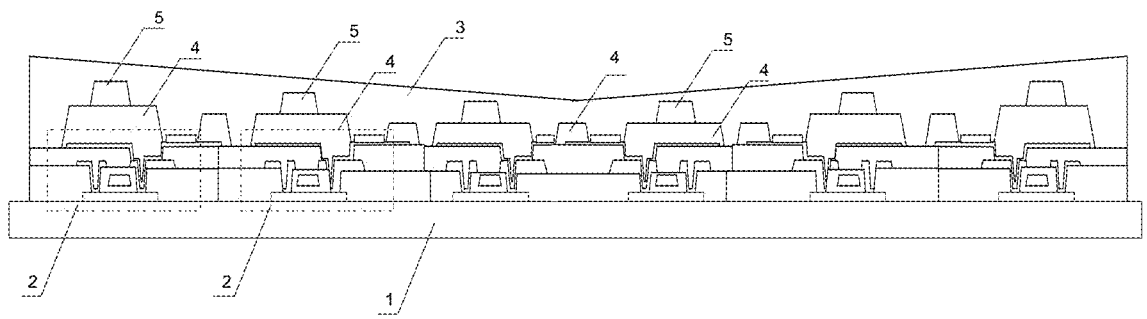
FIG. 3 is a schematic diagram showing a portion of the structure of the OLED display panel corresponding to an A-A section in FIG. 2.

FIG. 2 is a schematic diagram showing a structure of an OLED display panel according to an embodiment of the present disclosure. FIG. 3 is a schematic diagram showing a portion of the structure of the OLED display panel corresponding to an A-A section in FIG. 2. As shown in FIG. 2 and FIG. 3, an embodiment of the present disclosure provides an OLED display panel, including a base substrate 1, pixel units 2 located on the base substrate 1, and an encapsulation layer 3 covered on the pixel units 2. Further, as shown in FIG. 2, seen from the A-A section, the encapsulation layer 3 on the pixel units 2 has a gradually increasing thickness in a direction from a central position CE of the display panel to an edge position ED of the display panel. That is to say, the thickness of the encapsulation layer 3 on the pixel units 2 becomes larger in the direction from the central position CE of the display panel to the edge position ED of the display panel.

In accordance with an optional embodiment of the present disclosure, the display panel body includes a base substrate and a pixel-defining layer disposed on the base substrate. The pixel-defining layer is applied to define one or more pixel units, and the thickness of the pixel-defining layer is substantially equal in the direction from the central position of the display panel to the edge position of the display panel. Here, as one non-limiting example, the thickness being substantially equal refers to both upper limits and lower limits of thickness difference between the thickness of the pixel-defining layer at the central position of the display panel and the thickness of the pixel-defining layer at the edge position of the display panel are within 5%.

The expression "the encapsulation layer 3 on the pixel units 2 has a gradually increasing thickness" herein means that in the direction from the central position CE of the display panel to the edge position ED of the display panel, the thickness of the encapsulation layer 3 on the pixel units 2 tends to increase and that regions of the encapsulation layer covered on some adjacent pixel units can have an equal thickness. According to an optional embodiment of the present disclosure, the thickness of the encapsulation layer 3 covered on the pixel units 2 is the smallest at the central position CE of the display panel, and is sequentially increased based on a predetermined increment in the direction from the central position CE of the display panel to the edge position ED of the display panel. For example, the predetermined increment can be set to satisfy a linear, exponential, logarithmic, square, square root or other relationship as desired. Here, as shown in FIG. 2, in the XYZ coordinate system, X indicates the horizontal direction, Y indicates the vertical direction, and Z indicates the thickness direction of the display panel. For example, in a horizontal direction X of the display panel, the central position CE of the display panel is a position of the display panel where a line which passes through a center point of the display panel and which is perpendicular to the horizontal direction X (I2 in FIG. 2) is located. As another example, in a vertical direction Y of the display panel, the central position CE of the display panel is a position of the display panel where a line which passes through a center point of the display panel and which is perpendicular to the vertical direction Y (I1 in FIG. 2) is located. Among the pixel units 2 on the same horizontal line, a region of the encapsulation layer 3 covered on the pixel unit 2 at the central position CE has the smallest thickness, and another region of the encapsulation layer 3 covered on the pixel unit at the edge position ED of the display panel has the largest thickness. The encapsulation layer 3 is implemented by using a Thin-Film Encapsulation (TFE) technology, for example.

In this embodiment, the center point of the display panel is not limited to a geometric center of the display panel, and a point on a central line of the display panel may be any point within a predetermined range of the geometric center of the display panel. In addition, the center point of the display panel can be selected as a geometric center point of the display panel, such as a center of gravity or a center of a circle. Moreover, the display panel body includes a base substrate 1 and at least one pixel unit 2 disposed on the base substrate 1, and the central position of the display panel refers to one pixel unit 2 disposed on the display panel body, or the central position of the display panel refers to a group of the pixel units 2 consisting of a plurality of pixel units 2 disposed on the display panel body.

In addition, in a vertical direction of the display panel, the central position CE of the display panel is a position of the display panel where a line which passes through the center point a of the display panel and which is parallel to the horizontal direction X (I1 in FIG. 2) is located. Among a plurality of pixel units 2 on the same vertical line (i.e., a line perpendicular to the horizontal direction X), a region of the encapsulation layer 3 covered on the pixel unit(s) 2 at the central position CE has the smallest thickness, and another region of the thickness of the encapsulation layer 3 covered on the pixel unit 2 at the edge position ED of the display panel has the largest thickness, for example.

Similarly, in the horizontal direction X of the display panel, the central position CE of the display panel is a position of the display panel where a line which passes through the center point of the display panel and which is parallel to the vertical direction is located. Among the pixel units 2 on the same horizontal line (i.e., a line perpendicular to the vertical line), a region of the encapsulation layer 3 covered on the pixel unit(s) 2 at the central position CE has the smallest thickness, and another region of the encapsulation layer 3 covered on the pixel unit 2 at the edge position ED of the display panel has the largest thickness, for example.

According to an optional embodiment of the present disclosure, regions of the encapsulation layer 3 covered on the respective pixel units 2 at the central position CE have an identical thickness.

According to an optional embodiment of the present disclosure, the central position CE may also be the center point of the display panel. In this case, in directions radiating from the central position CE as a starting point towards edges of the display panel, the thickness of the encapsulation layer 3 on the pixel units 2 gradually increases.

In the OLED display panel in the embodiments of the present disclosure, the thickness of the encapsulation layer 3 on the pixel units 2 gradually increases in the direction from the central position CE of the display panel to the edge position ED of the display panel, which results in an increase in a resonant cavity length of the pixel units 2 at the edge position ED of the display panel, allowing a gradual increase in the wavelength of a luminescence spectrum peak of the organic light-emitting diode, and thus effectively mitigating the blue shift of the luminescence peak position of the pixels at the edge of the display panel.

Figure 4:
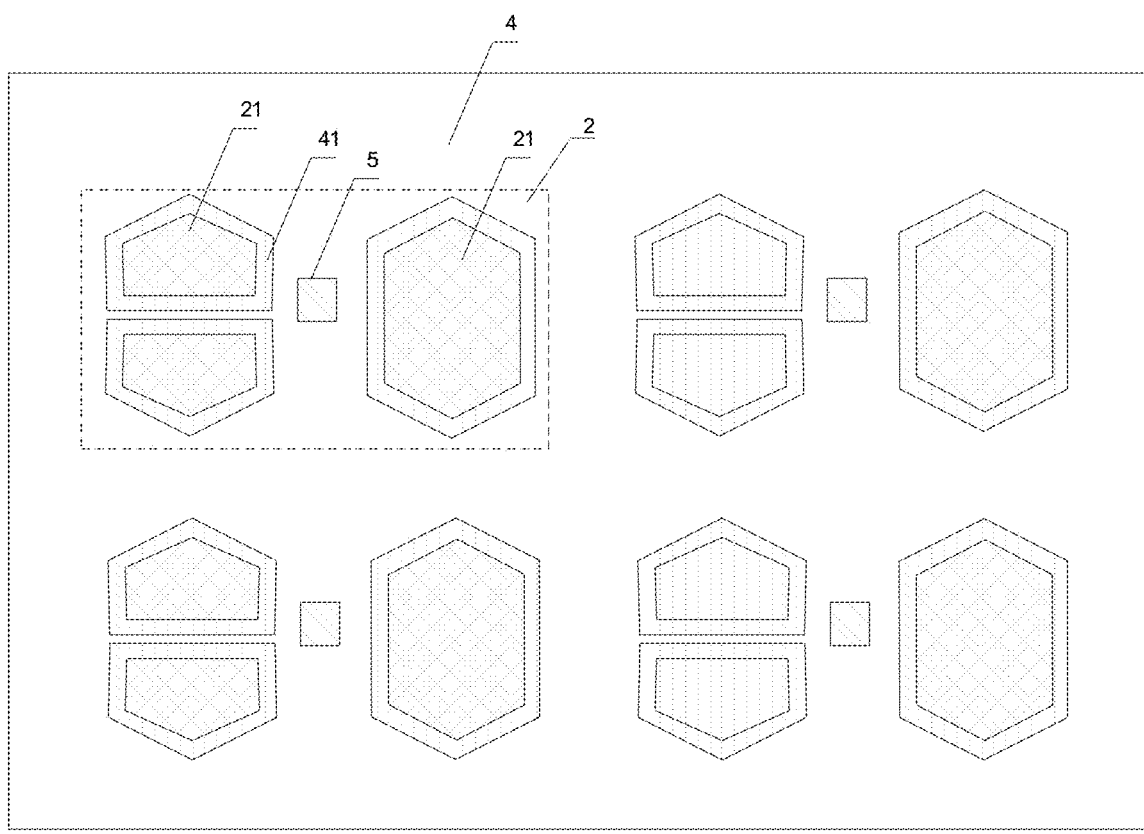
FIG. 4 is a schematic diagram showing a portion of the structure of the OLED display panel according to the embodiment of the present disclosure.

Further, as shown in FIG. 3 and FIG. 4, in one embodiment of the present disclosure, the display panel further includes a pixel-defining layer 4 which has a gradually increasing thickness in the direction from the central position CE of the display panel to the edge position ED of the display panel. Since the encapsulation layer 3 needs to cover the entire pixel-defining layer 4 (the encapsulation layer 3 needs to cover a top of the pixel-defining layer 4), the larger the thickness of the pixel-defining layer 4 is, the larger the thickness of the encapsulation layer 3 is required to be. In other words, the thickness of the encapsulation layer 3 is associated with the thickness of the pixel-defining layer 4.

As shown in FIG. 4 which is a schematic top view showing a part of the pixel units, the pixel-defining layer 4 is configured to define a light-emitting element 21, and a reference numeral 41 indicates an aperture of the pixel-defining layer.

The thickness of the pixel-defining layer 4 on the pixel units 2 is the smallest at the central position CE of the display panel, and can be sequentially increased based on a predetermined increment in the direction from the central position CE of the display panel to the edge position ED of the display panel, so that the thickness of the encapsulation layer 3 covered on the pixel units 2 can be sequentially increased based on the predetermined increment. For example, in the horizontal direction X of the display panel, the central position CE of the display panel is a position of the display panel where a line which passes through the center point of the display panel and which is perpendicular to the horizontal direction X is located. Among the pixel units 2 on the same horizontal line, a region of the pixel-defining layer 4 of the pixel unit(s) 2 at the central position CE has the smallest thickness, and another region of the pixel-defining layer 4 of the pixel unit 2 at the edge position ED of the display panel has the largest thickness, for example.

In addition, in the vertical direction of the display panel, the central position CE of the display panel is a position of the display panel where a line which passes through the center point of the display panel and which is parallel to the horizontal direction X is located. Among the pixel units 2 on the same vertical line (i.e., a line perpendicular to the horizontal direction X), a region of the pixel-defining layer 4 of the pixel unit(s) 2 at the central position CE has the smallest thickness, and another region of the pixel-defining layer 4 of the pixel unit 2 at the edge position ED of the display panel has the largest thickness, for example.

Further, in another embodiment of the present disclosure, the OLED display panel further includes a spacer 5 disposed on the pixel-defining layer 4, which has an equal or gradually increasing thickness in the direction from the central position CE of the display panel to the edge position ED of the display panel.

When the spacer 5 provided on the pixel-defining layer 4 has a constant thicknesses, the thickness of the encapsulation layer 3 covered on the pixel units 2 is associated with the thickness of the pixel-defining layer 4. When the thickness of the one or more spacers 5 provided on the pixel-defining layer 4 is not consistent, the thickness of the encapsulation layer 3 covered on the pixel units 2 is associated with the thicknesses of the pixel-defining layer 4 and the spacer 5. As shown in FIG. 2, at the pixel unit 2 where the encapsulation layer has the smallest thickness, only the pixel-defining layer 4 is shown, but the pixel-defining layer 4 at this position can also by covered by the spacer 5.

FIG. 5 is a schematic diagram showing a variation in a viewing angle when a viewer views an OLED display panel according to an embodiment of the present disclosure, in which Δh is a difference in thickness between a combination layer of the pixel unit(s) 2 at the central position CE and a combination layer of the pixel unit 2 at the edge position ED. Here, as shown in FIG. 5, in the XYZ coordinate system, X indicates the horizontal direction, Y indicates the vertical direction, and Z indicates the thickness direction of the display panel. Here, as a non-limiting example, the combination layer includes the pixel-defining layer 4 and the spacer 5. Correspondingly, a light-emitting center in FIG. 5 is the pixel unit.

In the direction from the central position CE of the display panel to the edge position ED of the display panel, the thickness of the encapsulation layer 3 on the pixel units 2 gradually increases.

Further, in a further embodiment of the present disclosure, in the horizontal direction X of the display panel, a difference in thickness between the combination layers of adjacent pixel units 2 is $\Delta h_1$;

$$\Delta h_1 = 2 \times |H_0 - H_{n-1}|/(n-1)$$

where the combination layer includes the pixel-defining layer 4 and the spacer 5, $H_0$ is a thickness of the combination layer of the pixel units 2 on a center line of the display panel perpendicular to the horizontal direction X, $H_{n-1}$ is a thickness of the combination layer of the pixel unit 2 at an edge position ED of the display panel in the horizontal direction X, and n is the number of the pixel units 2 of the display panel in the horizontal direction X.

Specifically, the center line of the display panel perpendicular to the horizontal direction X is a line which is perpendicular to the horizontal direction X and which passes through the center point of the display panel. The difference in thickness between the combination layers of the adjacent pixel units 2 located on the same horizontal line is $\Delta h_1$. According to an optional embodiment of the present disclosure, the combination layers of the respective pixel units 2 on the same vertical line are equal in thickness so as to reduce the manufacturing complexity.

Further, in an embodiment of the present disclosure, the difference in thickness between the combination layers of adjacent pixel units 2 in the vertical direction of the display panel is $\Delta h_2$;

$$\Delta h_2 = 2 \times |H_0 - H_{m-1}|/(m-1)$$

where the combination layer includes the pixel-defining layer 4 and the spacer 5, $H_0$ is a thickness of the combination layer of the pixel units 2 on a center line of the display panel parallel to the horizontal direction X, $H_{m-1}$ is a thickness of the combination layer of the pixel unit 2 at an edge position ED of the display panel in the vertical direction, and m is the number of the pixel units 2 of the display panel in the vertical direction.

Specifically, the center line of the display panel parallel to the horizontal direction X is a line which is parallel to the horizontal direction X and which passes through the center point of the display panel. In this case, the difference in thickness between the combination layers of adjacent pixel units 2 on the same vertical line is $\Delta h_2$. According to an optional embodiment of the present disclosure, the combination layers of the respective pixel units 2 on the same horizontal line are equal in thickness so as to reduce the manufacturing complexity.

Generally, the display panel has a size between 55 inches and 110 inches. Assuming that a viewing distance is in a range between 5 and 7 meters, the thickness of the combination layer can be obtained using an optical cavity length of the pixel unit 2 according to a formula $L\cos\alpha = p\lambda$, where L is related to the optical cavity length, α is a viewing angle, λ is an emission wavelength of the organic light-emitting device, and p is a positive integer. Then, $\Delta h_1$ or $\Delta h_2$ can be calculated based the thicknesses of the combination layers of the pixel units 2 at the central position CE and at the edge position ED. According to an optional embodiment of the present disclosure, $\Delta h_1$ or $\Delta h_2$ has a value ranging from approximately 5 μm to approximately 20 μm. Here, approximately refers to both the upper limit value 20 μm and the lower limit value 5 μm are allowable to have a 5% tolerance, for example.

In the OLED display panel provided by the embodiments of the present disclosure, the thickness of the combination layer gradually increases from the central position CE to the edge position ED. When the viewing angle α is kept unchanged, increasing the optical cavity length can cause a red shift of the wavelength of the resonance, so that gradually increasing the thickness of the encapsulation layer 3 from the central position CE to the edge position ED can achieve the purpose of mitigating the blue shift of the luminescence peak of the pixels at the edge of the OLED display panel.

Furthermore, embodiments of the present disclosure further provide an OLED display device including the OLED display panel in the above embodiments.

As shown in FIG. 6, embodiments of the present disclosure further provide a method for manufacturing an OLED display panel, including:

a step 101 of forming an encapsulation layer 3 that has a gradually increasing thickness in a direction from a central position CE of the display panel to an edge position ED of the display panel.

Prior to this step, one or more pixel units 2 can be formed on a base substrate 1, and then covered by the encapsulation layer 3 in such a manner that the encapsulation layer 3 on the pixel unit(s) 2 has the gradually increasing thickness in the direction from the central position CE of the display panel to the edge position ED of the display panel.

According to the manufacturing method of the OLED display panel provided by the embodiments of the present disclosure, by forming the encapsulation layer 3 which has the thickness that gradually increases in the direction from the central position CE of the display panel to the edge position ED of the display panel, it is possible to achieve the purpose of mitigating the blue shift of the luminescence peak of the pixels at the edge of the OLED display panel.

Further, in an embodiment of the present disclosure as shown in FIG. 7, prior to step 101, the method further includes:

a step 101a of forming a pixel-defining layer 4 that has a gradually increasing thickness in the direction from the central position CE of the display panel to the edge position ED of the display panel. Since the encapsulation layer 3 covered on the pixel units 2 has certain fluidity, the pixel-defining layer 4 of the pixel units 2 can play an important role of supporting the encapsulation layer 3 covered on the pixel units 2. By gradually increasing the thickness of the pixel-defining layer 4 on the pixel units 2 in the direction from the central position CE of the display panel to the edge position ED of the display panel, it is possible to enable the thickness of the encapsulation layer 3 covered on the pixel units 2 to gradually increase.

Further, as shown in FIG. 7, after step 101a and before step 101, the manufacturing method further includes step 101b:

forming, on the pixel-defining layer 4, an etched spacer 5 that has an equal or gradually increasing thickness in the direction from the central position CE of the display panel to the edge position ED of the display panel.

When the thickness of the one or more spacers 5 provided on the pixel-defining layer 4 is consistent, the thickness of the encapsulation layer 3 covered on the pixel units 2 is associated with the thickness of the pixel-defining layer 4. When the thickness of the one or more spacers 5 provided on the pixel-defining layer 4 is not consistent, the thickness of the encapsulation layer 3 covered on the pixel units 2 is associated with the thicknesses of the pixel-defining layer 4 and of the spacer 5, and the spacer 5 will also function to support the encapsulation layer 3.

In this embodiment, the thickness of the encapsulation layer 3 covered on the pixel unit 2 is determined by the thicknesses of both the pixel-defining layer 4 and the spacer 5. Thus, the resonant cavity length of the pixel unit 2 at the edge position ED of the display panel is increased to enable the wavelength of the luminescence spectrum peak of the OLED to be gradually increased, thereby mitigating the phenomenon of the blue shift of the luminescence peak position of the pixels at the edge of the display panel.

The above are some optional embodiments of the present disclosure, and it should be indicated that those having ordinary skills in the art can also make several improvements and modifications without departing from the principles of the present disclosure, and such improvements and modifications should be also considered as falling within the protection scope of the present disclosure.

What is claimed is:

1. A display panel, comprising:
    a display panel body; and
    an encapsulation layer disposed on the display panel body and applied to encapsulate the display panel body,
    wherein the encapsulation layer has a gradually increasing thickness in a direction from a central position of the display panel to an edge position of the display panel,
    wherein the display panel body comprises a base substrate and a pixel-defining layer disposed on the base substrate,
    wherein the pixel-defining layer is applied to define one or more pixel units, and
    wherein the pixel-defining layer has a thickness that gradually increases in the direction from the central position of the display panel to the edge position of the display panel.

2. The display panel according to claim 1, wherein the thickness of the encapsulation layer gradually increases at a plurality of points in the direction from the central position of the display panel to the edge position of the display panel.

3. The display panel according to claim 1, wherein the thickness of the pixel-defining layer gradually increases at a plurality of points in the direction from the central position of the display panel to the edge position of the display panel.

4. The display panel according to claim 1, wherein the display panel further comprises one or more spacers disposed on the pixel-defining layer; and the one or more spacers have an equal or gradually increasing thickness in the direction from the central position of the display panel to the edge position of the display panel.

5. The display panel according to claim 4, wherein the thickness of the one or more spacers disposed on the pixel-defining layer is equal or gradually increasing at a plurality of points in the direction from the central position of the display panel to the edge position of the display panel.

6. The display panel according to claim 4, wherein pixel units are covered by the encapsulation layer, a combination layer at adjacent pixel units in a horizontal direction of the display panel having a difference in thickness $\Delta h_1$;

$$\Delta h_1 = 2 \times |H_0 - H_{n-1}|/(n-1)$$

wherein the combination layer comprises the pixel-defining layer and the one or more spacers, $H_0$ is a thickness of the combination layer of the pixel units on a center line of the display panel perpendicular to the horizontal direction, $H_{n-1}$ is a thickness of the combination layer of the pixel unit at the edge position of the display panel in the horizontal direction, and n is the number of the pixel units of the display panel in the horizontal direction.

7. The display panel according to claim 6, wherein $\Delta h_1$ has a value ranging from approximately 5 μm to approximately 20 μm.

8. The display panel according to claim 4, wherein pixel units are covered by the encapsulation layer, a combination layer at adjacent pixel units in a vertical direction of the display panel having a difference in thickness $\Delta h_2$;

$$\Delta h_2 = 2 \times |H_0 - H_{m-1}|/(m-1)$$

wherein the combination layer comprises the pixel-defining layer and the one or more spacers, $H_0$ is a thickness of the combination layer of the pixel units on a center line of the display panel parallel to the horizontal direction, $H_{m-1}$ is a thickness of the combination layer of the pixel unit at the edge position of the display panel in the vertical direction, and m is the number of the pixel units of the display panel in the vertical direction.

9. The display panel according to claim 8, wherein $\Delta h_2$ has a value ranging from approximately 5 μm to approximately 20 μm.

10. The display panel according to claim 1, wherein the display panel body comprises a base substrate and at least one pixel unit disposed on the base substrate; and
    wherein the central position of the display panel refers to one pixel unit disposed on the display panel body, or the central position of the display panel refers to a group of the pixel units consisting of a plurality of pixel units disposed on the display panel body.

11. The display panel according to claim 10, wherein regions of the encapsulation layer covered on the group of the pixel units at the central position have an approximately same thickness.

12. The display panel according to claim 1, wherein the display panel is an Organic Light-Emitting Diode (OLED) display panel.

13. An Organic Light-Emitting Diode (OLED) display device, comprising the display panel according to claim 1.

14. A method for manufacturing the display panel of claim 1, comprising:
    preparing a display panel body of the display panel, wherein the display panel is an Organic Light-Emitting Diode (OLED) display panel;

forming the encapsulation layer on the display panel body, such that the encapsulation layer has the gradually increasing thickness in the direction from the central position of the display panel to the edge position of the display panel; and prior to forming the encapsulation layer, forming the pixel-defining layer that has the gradually increasing thickness in the direction from the central position of the display panel to the edge position of the display panel, wherein the pixel-defining layer is applied to define one or more pixel units.

15. The method according to claim 14, wherein the thickness of the encapsulation layer gradually increases at a plurality of points in the direction from the central position of the display panel to the edge position of the display panel.

16. The method according to claim 14, wherein the thickness of the pixel-defining layer gradually increases at a plurality of points in the direction from the central position of the display panel to the edge position of the display panel.

17. The method according to claim 14, wherein, after forming the pixel-defining layer and before forming the encapsulation layer, the method further comprises:

forming, on the pixel-defining layer, one or more spacers that have an equal or gradually increasing thickness in the direction from the central position of the display panel to the edge position of the display panel.

\* \* \* \* \*